US011664244B2

(12) United States Patent
Takahashi et al.

(10) Patent No.: US 11,664,244 B2
(45) Date of Patent: May 30, 2023

(54) CERAMIC HEATER

(71) Applicant: NGK INSULATORS, LTD., Nagoya (JP)

(72) Inventors: Tomohiro Takahashi, Nagoya (JP); Ryohei Matsushita, Yokkaichi (JP)

(73) Assignee: NGK INSULATORS, LTD., Nagoya (JP)

( * ) Notice: Subject to any disclaimer, the term of this patent is extended or adjusted under 35 U.S.C. 154(b) by 380 days.

(21) Appl. No.: 16/929,743

(22) Filed: Jul. 15, 2020

(65) Prior Publication Data

US 2020/0350187 A1 Nov. 5, 2020

Related U.S. Application Data

(63) Continuation of application No. PCT/JP2019/047380, filed on Dec. 4, 2019.

(30) Foreign Application Priority Data

Dec. 20, 2018 (JP) .............................. JP2018-238226

(51) Int. Cl.
| | |
|---|---|
| *H01L 21/67* | (2006.01) |
| *H05B 3/28* | (2006.01) |
| *G01K 7/04* | (2006.01) |
| *H05B 1/02* | (2006.01) |
| *H05B 3/02* | (2006.01) |

(52) U.S. Cl.
CPC .......... *H01L 21/67103* (2013.01); *G01K 7/04* (2013.01); *H01L 21/67248* (2013.01);
(Continued)

(58) Field of Classification Search
CPC ... G01K 1/14; G01K 7/02; G01K 7/04; H05B 1/0233; H05B 2203/003; H05B 2203/005;
(Continued)

(56) References Cited

U.S. PATENT DOCUMENTS

2004/0026402 A1* 2/2004 Ito ..................... H01L 21/67109
219/448.11
2007/0251938 A1* 11/2007 Lin ........................ H05B 3/265
219/443.1
(Continued)

FOREIGN PATENT DOCUMENTS

| JP | 2003-224044 A1 | 8/2003 |
|---|---|---|
| JP | 2005-056759 A1 | 3/2005 |

(Continued)

OTHER PUBLICATIONS

International Search Report and Written Opinion (Application No. PCT/JP2019/047380) dated Feb. 15, 2019.
(Continued)

*Primary Examiner* — Sang Y Paik
(74) *Attorney, Agent, or Firm* — Burr Patent Law, PLLC

(57) ABSTRACT

A ceramic heater includes a ceramic plate in which inner circumferential side and outer circumferential side resistance heating elements are built in; and a cylindrical shaft joined to a rear surface of the ceramic plate. The long hole extends from a start point of the ceramic plate to a terminal position of the outer circumferential portion of the ceramic plate. The entrance portion of the long hole is a long groove. The long groove is provided to extend from the start point to an extended area. Terminals are provided at positions other than the long groove and in a shaft inside area.

13 Claims, 17 Drawing Sheets

(52) U.S. Cl.
CPC ............. *H05B 1/0233* (2013.01); *H05B 3/02* (2013.01); *H05B 3/283* (2013.01); *H05B 2203/005* (2013.01); *H05B 2203/016* (2013.01)

(58) Field of Classification Search
CPC .... H05B 2203/016; H05B 3/02; H05B 3/283; H05B 3/74
USPC ...................................................... 219/444.1
See application file for complete search history.

(56) References Cited

U.S. PATENT DOCUMENTS

| | | |
|---|---|---|
| 2012/0211933 A1 | 8/2012 | Goto |
| 2016/0002779 A1* | 1/2016 | Lin ................... H01J 37/32724 118/500 |
| 2019/0252162 A1* | 8/2019 | Ma ...................... C23C 16/4581 |

FOREIGN PATENT DOCUMENTS

| | | |
|---|---|---|
| JP | 2010-040422 A1 | 2/2010 |
| JP | 2012-160368 A1 | 8/2012 |
| JP | 2013-012413 A1 | 1/2013 |
| JP | 2017-191910 A1 | 10/2017 |
| WO | 2012/039453 A1 | 3/2012 |

OTHER PUBLICATIONS

English translation of the International Preliminary Report on Patentability (Chpater I) dated Jul. 1, 2021 (Application No. PCT/JP2019/047380).

\* cited by examiner

CERAMIC HEATER

BACKGROUND OF THE INVENTION

1. Field of the Invention

The present invention relates to a ceramic heater.

2. Description of the Related Art

From the past, a ceramic heater called 2-zone heater has been known, in which resistance heating elements are independently embedded in respectively the inner circumferential side and the outer circumferential side of a disc-shaped ceramic plate having a wafer mounting surface. For instance, PTL 1 discloses a ceramic heater 410 having a shaft illustrated in FIG. 19. The ceramic heater 410 having a shaft measures the temperature on the outer circumferential side of a ceramic plate 420 by an outer circumferential side thermocouple 450. A thermocouple guide 432 is a cylindrical member, which extends straight upward from a lower position internally of a straight shaft 440, then is bent in an arc shape and changes its direction 90°. The thermocouple guide 432 is attached to a slit 426a provided in the area which is of the rear surface of the ceramic plate 420 and surrounded by the straight shaft 440. The slit 426a forms an entrance portion of a thermocouple path 426. The outer circumferential side thermocouple 450 is inserted in the cylinder of the thermocouple guide 432, and reaches the terminal position of the thermocouple path 426.

CITATION LIST

Patent Literature

PTL 1: WO 2012/039453 (FIG. 11)

SUMMARY OF THE INVENTION

However, since the straight shaft 440 is used in the ceramic heater 410, the area proportion of the slit 426a in the area which is of the rear surface of the ceramic plate 420 and surrounded by the straight shaft 440 has been high. Thus, there has been a problem in that the area for arranging four terminals of a 2-zone heater is restricted by the slit 426a.

The present invention has been devised to solve such a problem, and it is a primary object to increase the degree of freedom of arrangement of terminals or the like in a multi-zone heater.

A ceramic heater of the present invention comprises:
a ceramic plate in a disc shape, the ceramic plate having a wafer mounting surface;
a cylindrical shaft having a small diameter portion and a large diameter portion having an end face joined to a rear surface of the ceramic plate, the rear surface being on an opposite side of the wafer mounting surface;
an inner circumferential side resistance heating element which is embedded in an inner circumferential portion of the ceramic plate;
an outer circumferential side resistance heating element which is embedded in an outer circumferential portion of the ceramic plate;
attached components including a pair of terminals of the inner circumferential side resistance heating element and a pair of terminals of the outer circumferential side resistance heating element; and a long hole extending from a start point in an inside area of the small diameter portion to a predetermined terminal position of the outer circumferential portion of the ceramic plate of the rear surface of the ceramic plate.

An internal space of the cylindrical shaft has a circular cylinder shaped space having a diameter equal to an inner diameter of the small diameter portion, and a ring-shaped extended space which is on an outer side of the circular cylinder shaped space and surrounded by the large diameter portion,
an entrance portion of the long hole is a long groove,
the long groove is provided to extend from the start point to an extended area within the extended space of the rear surface of the ceramic plate, and
the attached components are provided at a position other than the long groove and within an inside area of the small diameter portion of the rear surface of the ceramic plate.

In the ceramic heater, the internal space of the cylindrical shaft has a circular cylinder shaped space having a diameter equal to the inner diameter of the small diameter portion, and a ring-shaped extended space which is on the outer side of the circular cylinder shaped space and surrounded by the large diameter portion. The long hole extends from a start point in the inside area of the small diameter portion of the rear surface of the ceramic plate to the outer circumferential portion of the ceramic plate. The entrance portion of the long hole is a long groove. The long groove is provided to extend from the start point to the extended area. The attached components are provided at a position other than the long groove and in the inside area of the small diameter portion of the rear surface of the ceramic plate. Since the long groove is provided to enter the extended area, the proportion of the long groove in the inside area of the small diameter portion of the rear surface of the ceramic plate is smaller, as compared with the case where the long groove does not enter the extended area (in other words, the case where no extended area is provided). Therefore, the area where the attached components such as a terminal can be arranged is increased, as compared with the case where no extended area is provided. Consequently, the degree of freedom of arrangement of a terminal or the like can be increased in a multi-zone heater.

In the ceramic heater of the present invention, the long groove may be provided along a radial direction of the ceramic plate. In this manner, when a long hole having a long groove in the same size is provided, the length of the long hole is the shortest. Thus, the effect of the long hole on the thermal uniformity of the wafer can be reduced.

In the ceramic heater of the present invention, the long groove may be provided along a direction deviated from the radial direction of the ceramic plate. In this manner, the long groove does not pass through the center of the inside area of the small diameter portion of the rear surface of the ceramic plate, thus, the degree of freedom of arrangement of terminals can be increased.

In the ceramic heater of the present invention, the long hole may be a thermocouple insertion long hole in which a thermocouple is inserted. Thus, a thermocouple can be inserted utilizing the long hole.

In the ceramic heater of the present invention, the long groove may be used to arrange a curved portion included in a thermocouple guide, the curved portion being configured to change its direction from the vertical direction to the horizontal direction with respect to the wafer mounting surface. Thus, the degree of freedom of arrangement of terminals can be increased in a multi-zone heater including a cylindrical thermocouple guide which is bent from the vertical direction to the horizontal direction.

It is to be noted that "vertical" includes substantially vertical (for instance, within a range of tolerance) in addition to completely vertical. The same applies to "horizontal".

In the ceramic heater of the present invention, the extended space may be a space in a size which allows the curved portion of the thermocouple guide to be turned. Thus, the curved portion of the thermocouple guide can be arranged in the long groove while being turned in the extended space. Therefore, the cylindrical thermocouple guide curved from the vertical direction to the horizontal direction can be set more easily.

In the ceramic heater of the present invention, the length of the long groove may be set longer than or equal to the length of the leading portion, arranged in the long groove, of the curved portion of the thermocouple guide. Therefore, the thermocouple guide can be set more easily.

In the ceramic heater of the present invention, the outer diameter of the curved portion of the thermocouple guide may be smaller than the outer diameter of the vertical portion. Thus, the width of the long groove can be reduced.

The ceramic heater of the present invention may include the thermocouple guide arranged in the long groove, and in addition, may include a thermocouple which is inserted in the thermocouple guide and the long hole. When the thermocouple is included, a temperature sensing part of the thermocouple may be arranged to fall within the width of the outer circumferential side resistance heating element when viewed from the rear surface of the ceramic plate. In this manner, a temperature change in the outer circumferential side resistance heating element can be detected with a good response by the temperature sensing part of the outer circumferential side thermocouple.

In the ceramic heater of the present invention, the long hole may be a hole with a substantially quadrilateral cross section, and the boundary portion between the ceiling face and each lateral face of the hole may be a R-face (curved face) with a curvature radius of 0.5 mm or longer. In this manner, it is possible to reduce the occurrence of crack starting from the boundary portion between the ceiling face and a lateral face in the ceramic plate.

In the ceramic heater of the present invention, the long hole has a tapered portion in the middle of the path from the start point to the terminal position. The portion from the start point to one end of the tapered portion is a wide width portion. The portion from the other end of the tapered portion to the terminal position is a narrow width portion. In this manner, the outer circumferential side thermocouple is guided to the tapered portion and can be smoothly inserted in the long hole. In addition, if the curved portion is designed to come into contact the tapered portion when the outer circumferential side thermocouple is inserted in the long hole utilizing the thermocouple guide, the tapered portion plays a role of temporarily fixing the thermocouple guide, thus the outer circumferential side thermocouple is easily inserted.

In the ceramic heater of the present invention, the ceiling face of the long hole has an inclined face in the middle of the path from the start point to the terminal position, and the depth of the ceiling face from the start point to the inclined face may be greater than the depth from the inclined face to the terminal position. In this manner, the outer circumferential side thermocouple can be smoothly inserted in the long hole utilizing the thermocouple guide. It is to be noted that the boundary between the ceiling face and the standing wall at the terminal position may be an inclined face.

In the ceramic heater of the present invention, the temperature sensing part of the outer circumferential side thermocouple may be a convex curved face, and of the terminal face of the long hole, the portion in contact with the temperature sensing part of the outer circumferential side thermocouple may be a concave curved face. In this manner, the temperature sensing part of the outer circumferential side thermocouple comes into surface contact with or nearly surface contact with the terminal face of the long hole, which is a desired measurement point, thus the temperature measurement accuracy is improved.

In the ceramic heater of the present invention, the gap between the long groove and each of the attached components may be 2 mm or greater. In this manner, it is possible to prevent the occurrence of crack in the ceramic plate due to a narrow gap between the long groove and each of the attached components.

In the ceramic heater of the present invention, the wall at the entrance portion of the long hole may be bent toward the back of the long hole. In this manner, without using the thermocouple guide, the outer circumferential side thermocouple can be smoothly inserted in the long hole utilizing the wall bent at the entrance portion.

BRIEF DESCRIPTION OF THE DRAWINGS

FIG. 18 is an explanatory view of another example of the long hole 26 and the long groove 26a.

DETAILED DESCRIPTION OF THE INVENTION

Figure 1:
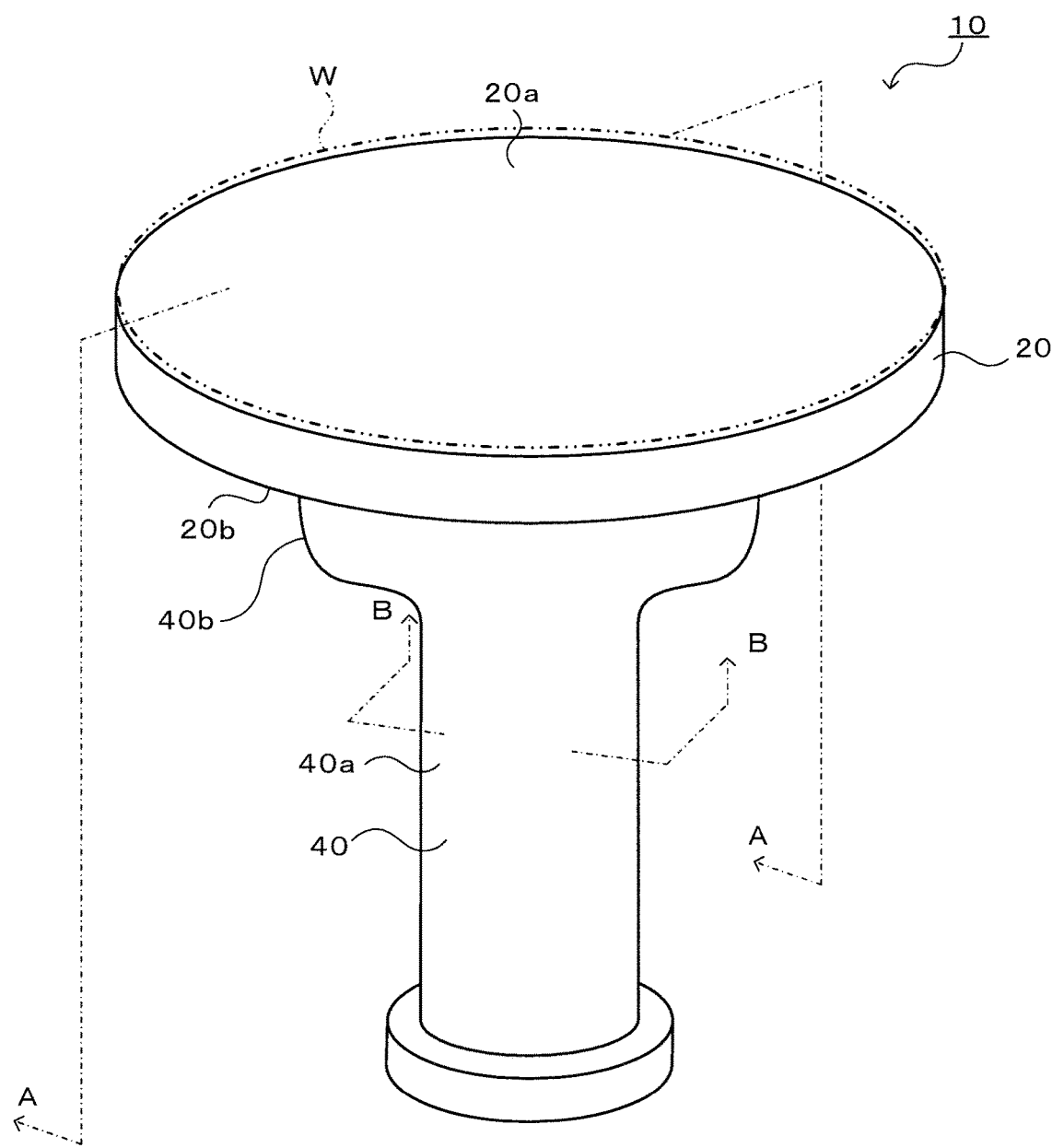
FIG. 1 is a perspective view of a ceramic heater 10.
Figure 2:
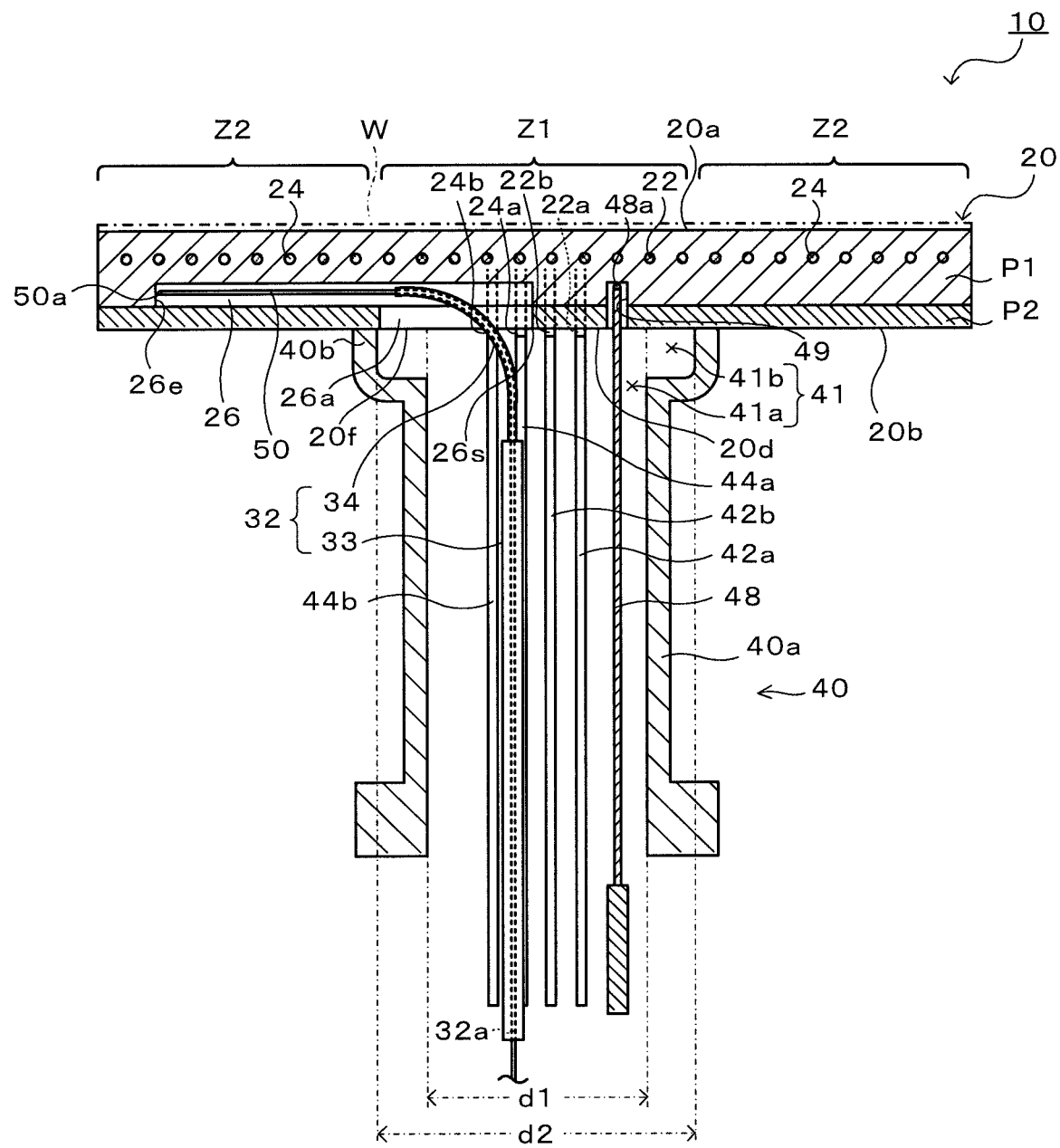
FIG. 2 is a cross-sectional view taken along A-A of FIG. 1.
Figure 3:
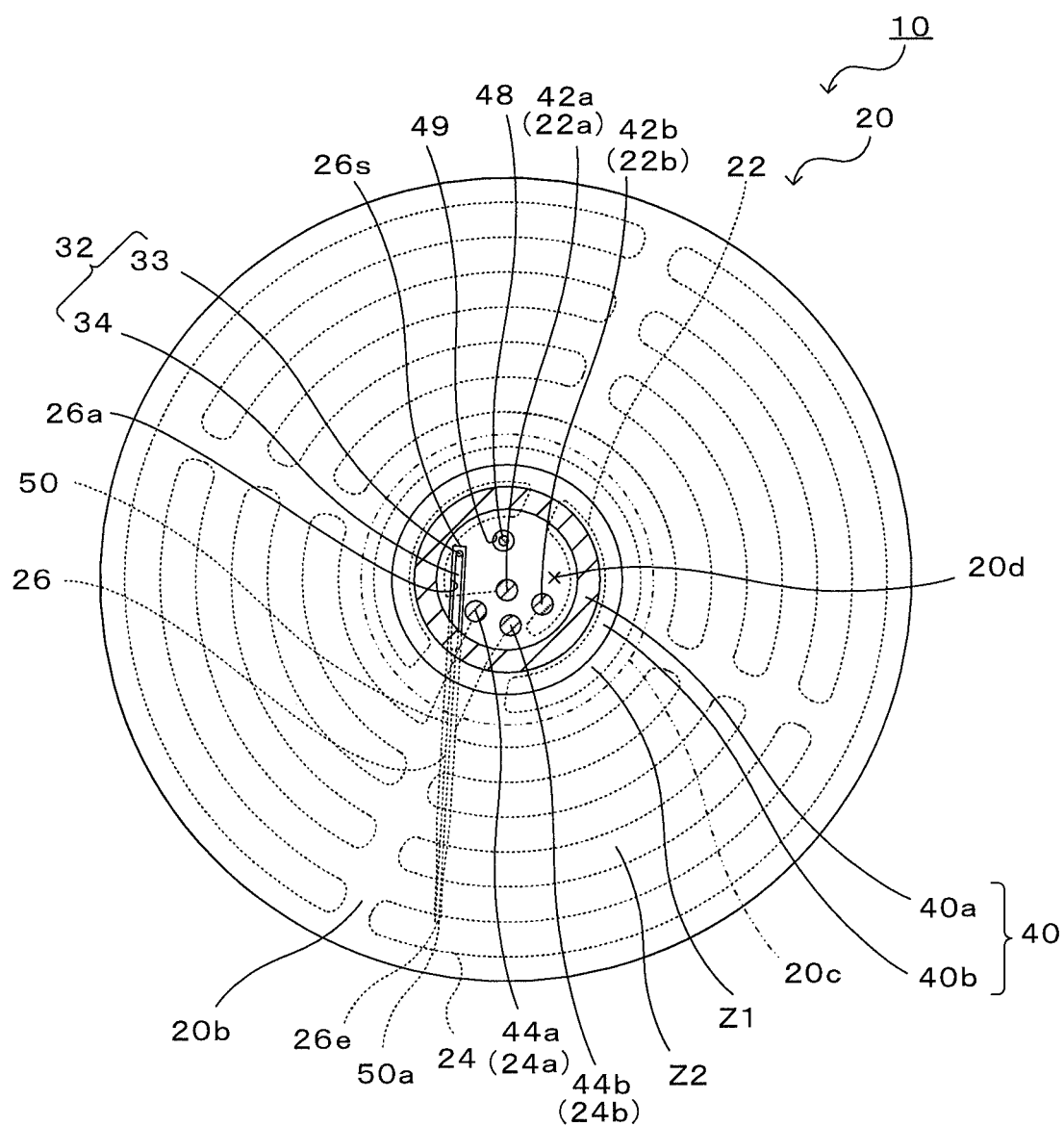
FIG. 3 is a cross-sectional view taken along B-B of FIG. 1.
Figure 4:
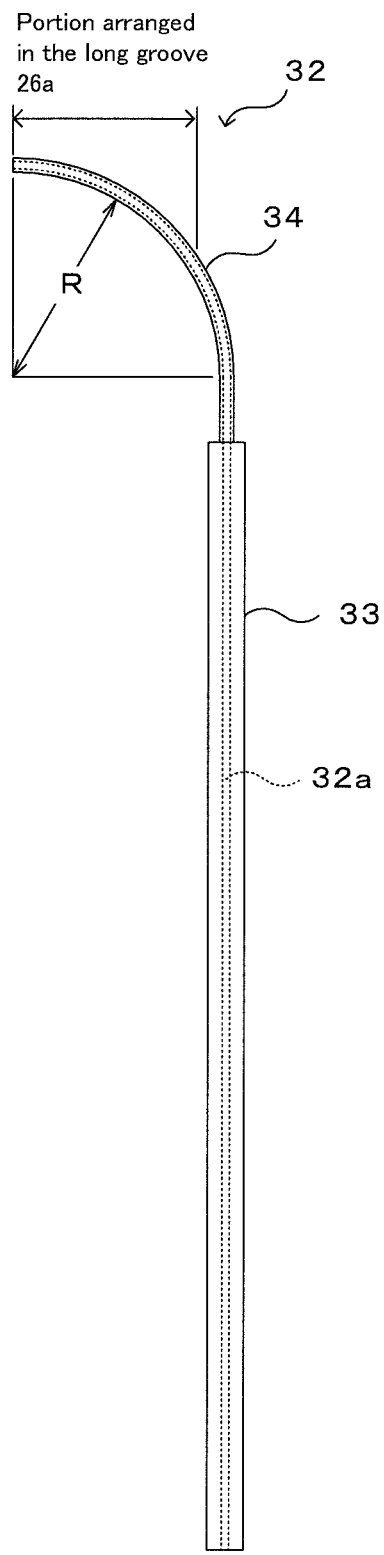
FIG. 4 is a front view of a thermocouple guide 32.
Figure 5:
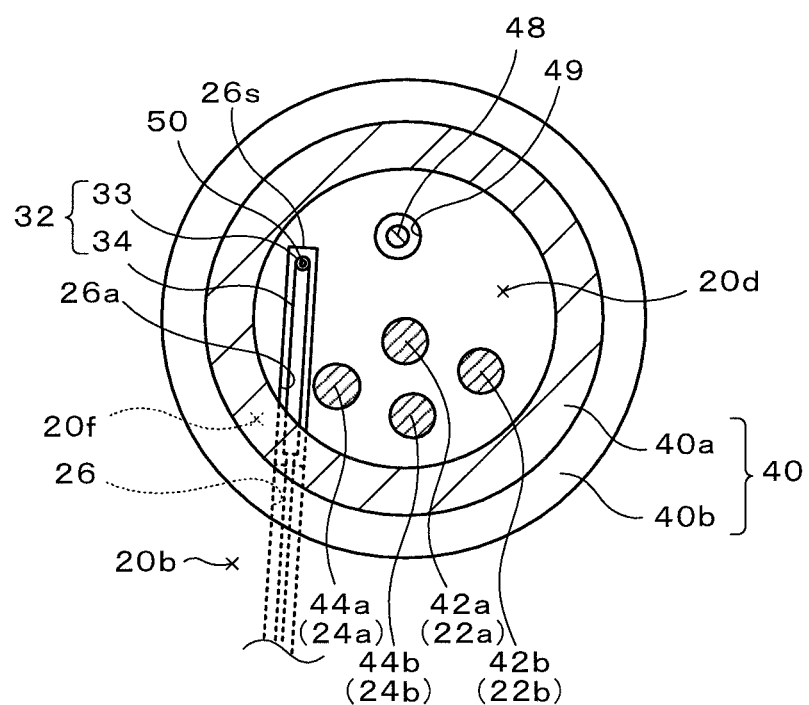
FIG. 5 is an enlarged view of a central portion of FIG. 3.

A preferred embodiment of the present invention will be described below with reference to the drawings. FIG. 1 is a perspective view of a ceramic heater 10, FIG. 2 is a cross-sectional view taken along A-A of FIG. 1, FIG. 3 is a cross-sectional view taken along B-B of FIG. 1, FIG. 4 is a front view of a thermocouple guide 32, and FIG. 5 is an enlarged view of a central portion of FIG. 3.

The ceramic heater 10 is used to heat a wafer W which undergoes processing such as etching and CVD, and is installed in a vacuum chamber which is not illustrated. The ceramic heater 10 includes a disc-shaped ceramic plate 20 having a wafer mounting surface 20a, and a cylindrical shaft 40 joined to the surface (rear surface) 20b on the opposite side of the wafer mounting surface 20a of the ceramic plate 20.

The ceramic plate 20 is a disc-shaped plate comprised of a ceramic material represented by aluminum nitride or alumina. The diameter of the ceramic plate 20 is not particularly limited, and is approximately 300 mm, for instance. The ceramic plate 20 is divided into a small circular inner circumferential side zone Z1 and a circular ring-shaped outer circumferential side zone Z2 by a virtual boundary 20c (see FIG. 3) concentric with the ceramic plate 20. An inner circumferential side resistance heating element 22 is embedded in the inner circumferential side zone Z1 of the ceramic plate 20, and an outer circumferential side resistance heating element 24 is embedded in the outer circumferential side zone Z2. Both resistance heating elements 22, 24 are formed of a coil which has a major component of molybdenum, tungsten, or tungsten carbide, for instance. As illustrated in FIG. 2, the ceramic plate 20 is produced by surface bonding an upper side plate P1 and a lower side plate P2 which is thinner than the upper side plate P1.

Like the ceramic plate 20, the cylindrical shaft 40 is comprised of ceramics such as aluminum nitride or alumina. The cylindrical shaft 40 includes a small diameter portion 40a and a large diameter portion 40b. The small diameter portion 40a is a portion of the cylindrical shaft 40 from the lower end thereof to a predetermined height, and is a cylindrical portion having an inner diameter d1. The large diameter portion 40b is a portion of the cylindrical shaft 40 from the predetermined height to the upper end thereof with an increasing diameter, and is a cylindrical portion having an inner diameter d2 (>d1). The upper end (end face of the large diameter portion 40b) of the cylindrical shaft 40 is diffusion bonded to the ceramic plate 20. An internal space 41 of the cylindrical shaft 40 has a circular cylinder shaped space 41a having the same diameter as the inner diameter of the small diameter portion 40a, and a ring-shaped extended space 41b which is on the outer side of the cylindrical space 41a and surrounded by the large diameter portion 40b. The extended space 41b is space which allows the leading end of a curved portion 34 of the later-described thermocouple guide 32 to be inserted while being turned.

As illustrated in FIG. 3, the inner circumferential side resistance heating element 22 is formed so as to start from one of a pair of terminals 22a, 22b, to be wired on substantially the entire area of the inner circumferential side zone Z1 while being folded back at multiple fold-back portions in a traversable manner, and to arrive at the other of the pair of terminals 22a, 22b. The pair of terminals 22a, 22b are provided in a shaft inside area 20d (an inside area of the small diameter portion 40a of the rear surface 20b of the ceramic plate 20). The pair of terminals 22a, 22b are respectively joined to power feeding rods 42a, 42b made of metal (for instance, made of Ni).

As illustrated in FIG. 3, the outer circumferential side resistance heating element 24 is formed so as to start from one of a pair of terminals 24a, 24b, to be wired on substantially the entire area of the outer circumferential side zone Z2 while being folded back at multiple fold-back portions in a traversable manner, and to arrive at the other of the pair of terminals 24a, 24b. The pair of terminals 24a, 24b are provided in the shaft inside area 20d of the rear surface 20b of the ceramic plate 20. The pair of terminals 24a, 24b are respectively joined to power feeding rods 44a, 44b made of metal (for instance, made of Ni).

As illustrated in FIG. 2, the inside of the ceramic plate 20 is provided with a long hole 26 for inserting an outer circumferential side thermocouple 50 and in parallel to the wafer mounting surface 20a. The long hole 26 is provided from a start point 26s in the shaft inside area 20d of the rear surface 20b of the ceramic plate 20 to a predetermined terminal position 26e of the outer circumferential portion of the ceramic plate 20. As illustrated in FIG. 3, the width of the long hole 26 is gradually decreased from a point near the terminal position 26e toward the terminal position 26e. As illustrated in FIG. 3 and FIG. 5, the long hole 26 is provided along a direction deviated from the radial direction of the ceramic plate 20. Of the long hole 26, an entrance portion from the start point 26s to an extended area 20f (the area in the extended space 41b of the rear surface 20b) is a long groove 26a in which the leading end of the curved portion 34 of the thermocouple guide 32 is fitted. The long groove 26a is opened to the internal space 41 of the cylindrical shaft 40. In the present embodiment, the long groove 26a extends from the start point 26s to the outer circumferential edge of the extended area 20f. The terminals 22a, 22b, 24a, 24b are provided at positions other than the long groove 26a and in the shaft inside area 20d.

As illustrated in FIG. 4, the thermocouple guide 32 is a cylindrical metal (for instance, stainless-steel) member including a guide hole 32a. The thermocouple guide 32 includes a vertical portion 33 extending in the vertical direction with respect to the wafer mounting surface 20a, and the curved portion 34 which changes its direction from the vertical direction to the horizontal direction. Although the outer diameter of the vertical portion 33 is larger than the outer diameter of the curved portion 34, the inner diameter of the vertical portion 33 is the same as the inner diameter of the curved portion 34. The outer diameter of the curved portion 34 is made smaller in this manner, thus the width of the long groove 26a in which the curved portion 34 is inserted can be decreased. However, the outer diameter of the vertical portion 33 may be the same as the outer diameter of the curved portion 34. The curvature radius R of the curved portion 34 is not particularly limited, however, is approximately 30 mm, for instance. The outer circumferential side thermocouple 50 is inserted in the guide hole 32a of the thermocouple guide 32. The leading end of the curved portion 34 may be simply inserted in the long groove 26a, or may be internally joined or bonded to the long groove 26a.

As illustrated in FIG. 2, inside the cylindrical shaft 40, the power feeding rods 42a, 42b respectively connected to the pair of terminals 22a, 22b of the inner circumferential side resistance heating element 22, and the power feeding rods 44a, 44b respectively connected to the pair of terminals 24a, 24b of the outer circumferential side resistance heating element 24 are disposed. Inside the cylindrical shaft 40, an inner circumferential side thermocouple 48 for measuring the temperature in the vicinity of the center of the ceramic plate 20, and an outer circumferential side thermocouple 50 for measuring the temperature in the vicinity of the outer circumference of the ceramic plate 20 are also arranged. The inner circumferential side thermocouple 48 is inserted in a recessed portion 49 provided in the rear surface 20b of the ceramic plate 20, and a temperature sensing part 48a at the leading end is in contact with the ceramic plate 20. The recessed portion 49 is provided at a position which does not interfere with the terminals 22a, 22b, 24a, 24b, and the long groove 26a. The outer circumferential side thermocouple 50 is a sheath thermocouple, which penetrates the guide hole 32a of the thermocouple guide 32 and the long hole 26, and a temperature sensing part 50a at the leading end reaches the terminal position 26e of the long hole 26.

Figure 6:
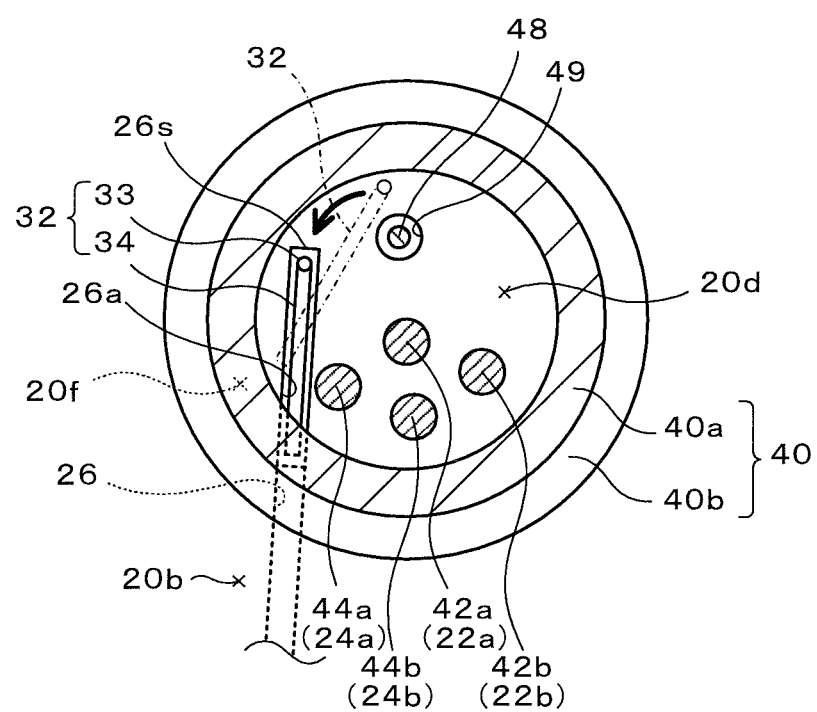
FIG. 6 is an explanatory view of a method of attaching the thermocouple guide 32.
Figure 7:
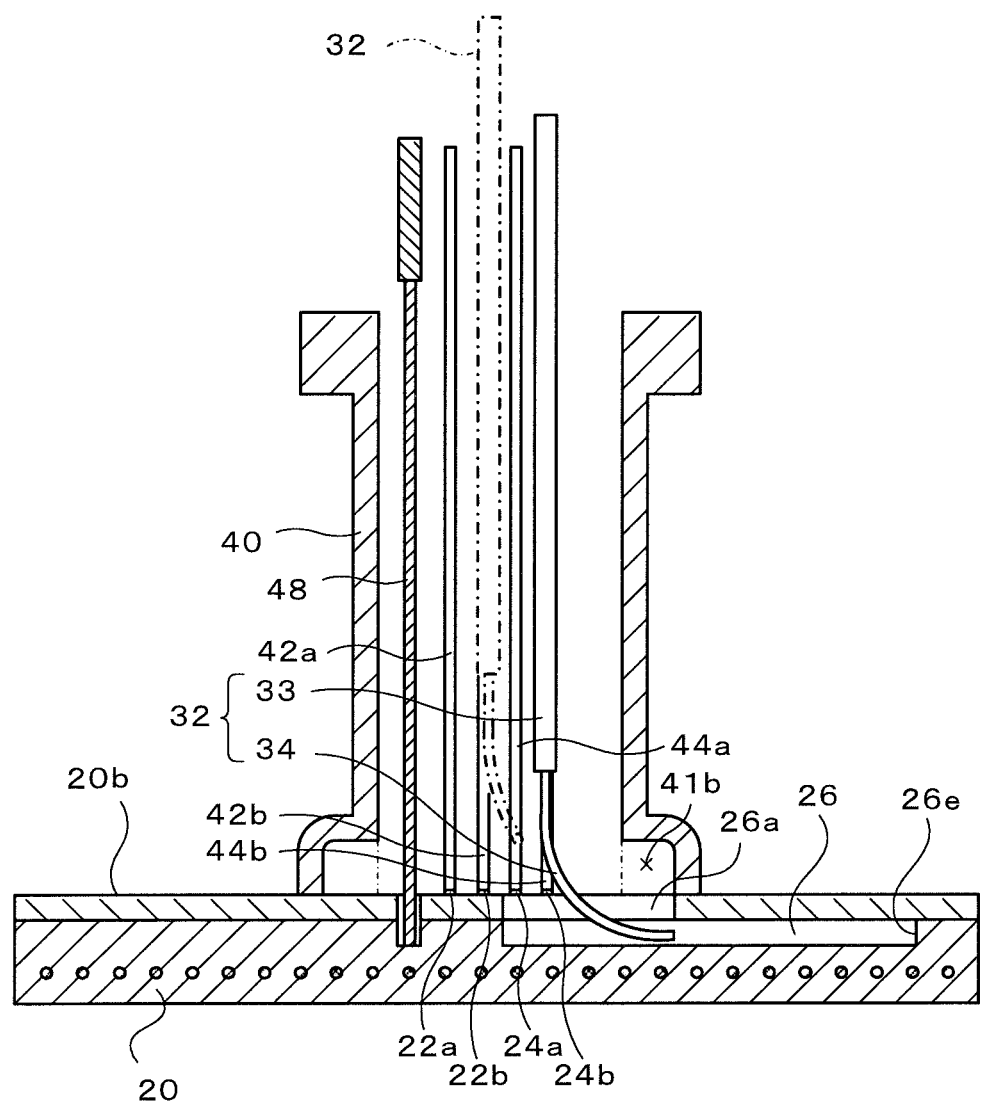
FIG. 7 is an explanatory view of a method of attaching the thermocouple guide 32.

The thermocouple guide 32 is attached in the final phase of the manufacturing process of the ceramic heater 10. The manner of the attachment then is illustrated in FIG. 6 and FIG. 7. As illustrated in FIG. 6 and FIG. 7, the power feeding rods 42a, 42b, 44a, 44b are respectively joined to the terminals 22a, 22b, 24a, 24b exposed to the rear surface 20b of the ceramic plate 20, and the cylindrical shaft 40 is joined to the rear surface 20b of the ceramic plate 20, then the thermocouple guide 32 is attached. In the present embodiment, the orientation of the curved portion 34 of the thermocouple guide 32 is adjusted to the orientation of the long groove 26a which is the entrance portion of the long hole 26, and subsequently, even when the thermocouple guide 32 is attempted to be inserted in the small diameter portion 40a of the cylindrical shaft 40, the length of the long hole 26 and its extension which appear in the shaft inside area 20d is shorter than the horizontal distance from the leading end of the curved portion 34 to the vertical portion 33, and the curved portion 34 gets caught on the small diameter portion 40a, thus the thermocouple guide 32 cannot be inserted in the small diameter portion 40a as it is. For this reason, first, the curved portion 34 of the thermocouple guide 32 is positioned (see the thermocouple guide 32 shown in a dashed-dotted line of FIG. 6 and FIG. 7) so as not to interfere with the small diameter portion 40a and the power feeding rods 42a, 42b, 44a, 44b, then the curved portion 34 is moved closer to the rear surface 20b of the ceramic plate 20. After the leading end of the curved portion 34 reaches the internal space of the large diameter portion 40b, the thermocouple guide 32 is turned so that the leading end of the curved portion 34 enters the extended space 41b, then the leading end of the curved portion 34 is fitted into the long groove 26a (see the thermocouple guide 32 shown in a solid line of FIG. 6 and FIG. 7). Subsequently, the outer circumferential side thermocouple 50 is inserted in the guide hole 32a of the thermocouple guide 32, thereby causing the temperature sensing part 50a to reach the terminal position 26e of the long hole 26.

Next, an example of use of the ceramic heater 10 will be described. First, the ceramic heater 10 is installed in a vacuum chamber which is not illustrated, and a wafer W is mounted on the wafer mounting surface 20a of the ceramic heater 10. The electric power supplied to the inner circumferential side resistance heating element 22 is adjusted so that the temperature detected by the inner circumferential side thermocouple 48 becomes a predetermined target inner circumferential side temperature, and the electric power supplied to the outer circumferential side resistance heating element 24 is adjusted so that the temperature detected by the outer circumferential side thermocouple 50 becomes a predetermined target outer circumferential side temperature. Thereby, the temperature of the wafer W is controlled at a desired temperature. The inside of the vacuum chamber is set to a vacuum atmosphere or a reduced-pressure atmosphere to generate plasma in the vacuum chamber, and CVD film formation is performed or etching is performed on the wafer W utilizing the plasma.

In the ceramic heater 10 in the present embodiment described above, since the long groove 26a is provided so as to enter the extended area 20f, the proportion of the long groove 26a in the shaft inside area 20d (the inside area of the small diameter portion 40a of the rear surface 20b of the ceramic plate 20) is smaller, as compared with the case where a long groove having the same length as that of the long groove 26a is provided in a straight shaft having no extended area. Therefore, the area where attached components such as the terminals 22a, 22b, 24a, 24b and the recessed portion 49 can be arranged is increased, as compared with the case where no extended area is provided. Consequently, the degree of freedom of arrangement of the terminals can be increased in a multi-zone heater including the cylindrical thermocouple guide 32 which is curved from the vertical direction to the horizontal direction.

In addition, since the cylindrical shaft 40 has the large diameter portion 40b, a heat conduction distance from the shaft upper end to the shaft lower end is increased, as compared with the case where the cylindrical shaft 40 does not have the large diameter portion 40b, thus the temperature of the shaft lower end can be reduced. The shaft lower end is fixed via an O-ring to a chamber which is not illustrated, thus the durability of the O-ring is improved for a reduced temperature of the shaft lower end.

In addition, since the long groove 26a is provided along a direction deviated from the radial direction of the ceramic plate 20, the long groove 26a does not pass through the center of the shaft inside area 20d. Therefore, the degree of freedom of arrangement of the terminals can be further increased. Also, the distance of the long groove 26a taking up the extended area 20f can be increased, and the distance of the long groove 26a taking up the shaft inside area 20d can be decreased.

Additionally, the extended space 41b is space in a size which allows the curved portion 34 of the thermocouple guide 32 to be turned. Thus, the curved portion 34 of the thermocouple guide 32 can be arranged in the long groove while being turned in the extended space 41b. Therefore, the thermocouple guide 32 can be set more easily.

Furthermore, the length of the long groove 26a serving as the entrance portion of the long hole 26 is set to be longer than or equal to the length of the leading portion, arranged in the long groove 26a, of the curved portion 34 of the thermocouple guide 32. Therefore, the thermocouple guide 32 can be set more easily.

The outer diameter of the curved portion 34 of the thermocouple guide 32 is made less than the outer diameter of the vertical portion 33, thus the width of the long groove 26a can be decreased.

Also, the curvature radius R of the curved portion 34 of the thermocouple guide 32 can be relatively increased, thus the outer circumferential side thermocouple 50 inserted in the thermocouple guide 32 can be smoothly changed in direction.

Still additionally, since the width of the long hole 26 is gradually decreased from a point near the terminal position 26e toward the terminal position 26e, the temperature sensing part 50a of the outer circumferential side thermocouple 50 is easily arranged at a desired measurement point (a point, in the vicinity of the terminal position 26e, of the ceramic plate 20).

The present invention is not limited to the embodiment described above, and needless to say, the present invention can be implemented in various manners as long as not departing from the technical scope of the present invention.

Figure 8:
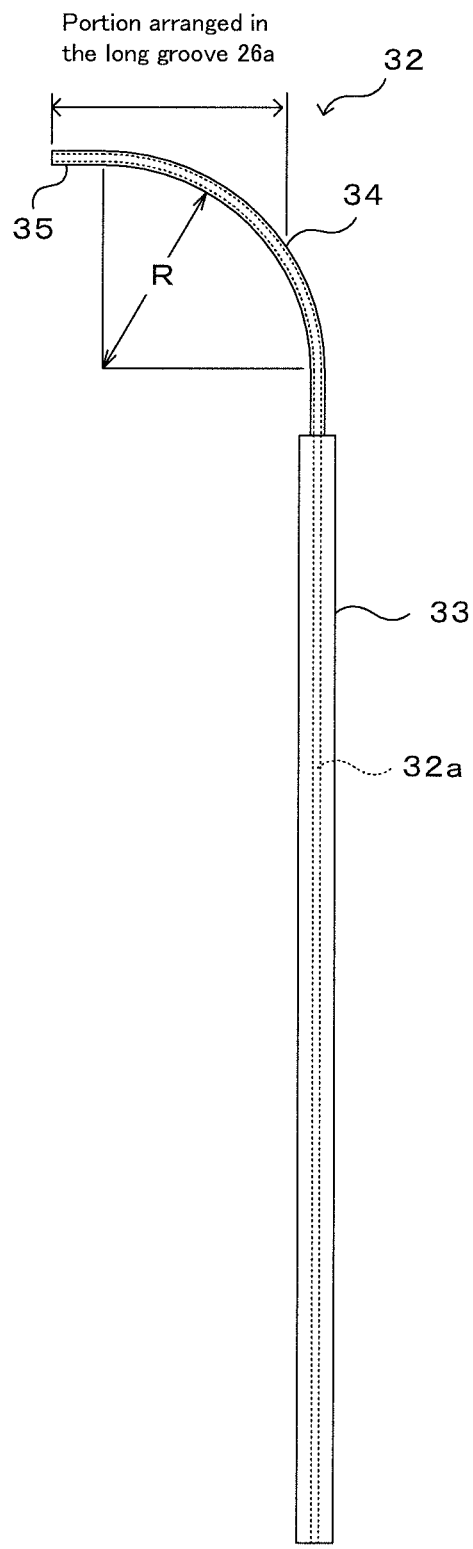
FIG. 8 is a front view of another example of the thermocouple guide 32.

For instance, in the above-described embodiment, as illustrated in FIG. 8, the thermocouple guide 32 may include a horizontal portion 35 which connects to the outlet of the curved portion 34 and extends in a direction horizontal to the wafer mounting surface 20a. In this manner, the outer circumferential side thermocouple 50 can be guided to the long hole 26 more smoothly. In addition, the thermocouple guide 32 having such a horizontal portion 35 has a long portion arranged in the long groove 26a. Thus, it is preferable that the length of the long groove 26a be set accordingly.

Figure 9:
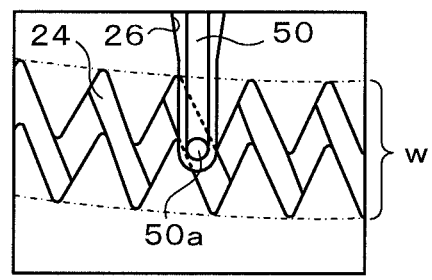
FIG. 9 is an explanatory view illustrating an example of a position of a temperature sensing part 50a of an outer circumferential side thermocouple 50.

In the embodiment described above, as illustrated in FIG. 9, the temperature sensing part 50a of the outer circumferential side thermocouple 50 in the long hole 26 may be arranged to fall within the width (specifically, the width w of the coil) of the outer circumferential side resistance heating element 24 when viewed from the rear surface 20b. When the outer circumferential side resistance heating element 24 is not in a coil shape but in a ribbon shape (elongated flat plate shape), the temperature sensing part 50a may be arranged to fall within the width of the ribbon. In this manner, a temperature change in the outer circumferential side resistance heating element 24 can be detected with a good response by the temperature sensing part 50a of the outer circumferential side thermocouple 50.

Figure 10:
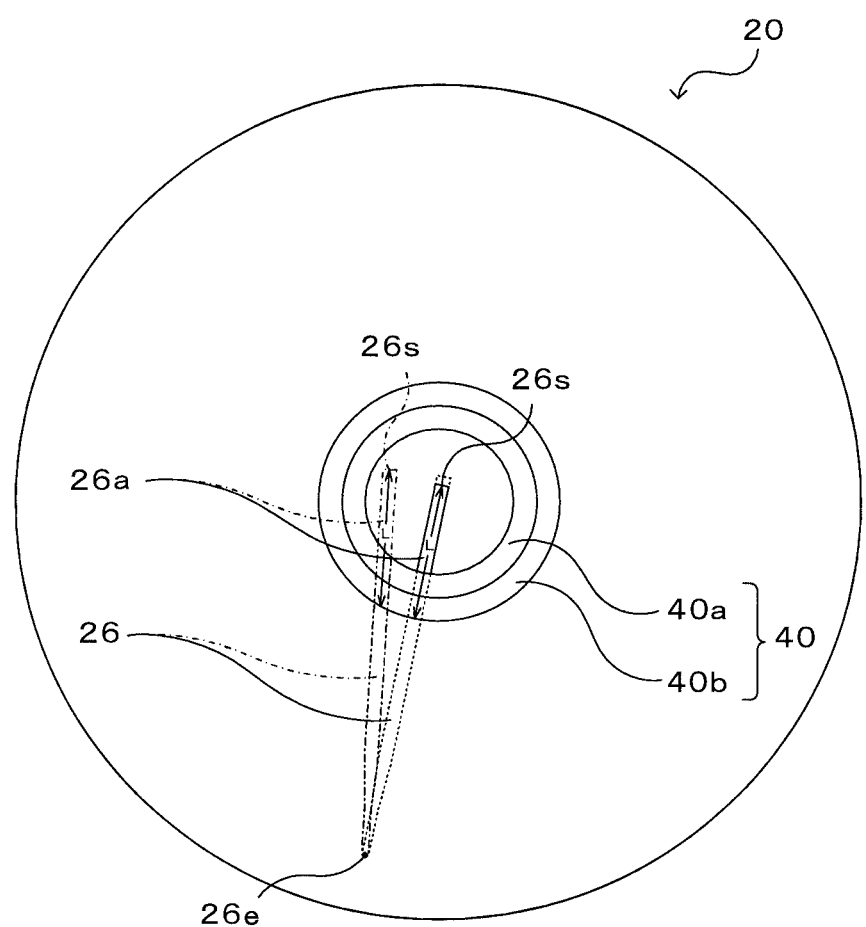
FIG. 10 is an explanatory view illustrating another example of a long hole 26.

In the above-described embodiment, the long hole 26 including the long groove 26a is provided along a direction deviated from the radial direction of the ceramic plate 20. However, as illustrated by the solid line of FIG. 10, the long hole 26 may be provided along a radial direction of the ceramic plate 20. The dashed-dotted line of FIG. 10 indicates the long hole 26 in the above-described embodiment, and the long hole 26 in the solid line has the same terminal position 26e as that of the long hole 26 shown in a dashed-dotted line, and includes the long groove 26a with the same length L. The length of the long hole 26 shown in a solid line is shorter (becomes the shortest) than the length of the long hole 26 shown in a dashed-dotted line by the dotted line portion of FIG. 10. Since the long hole 26 is a hollow, a longer one has a more effect on the thermal uniformity of the wafer W. When the long hole 26 shown in a sold line of FIG. 10 is used, the effect of the long hole 26 on the thermal uniformity of the wafer W can be reduced.

In the above-described embodiment, both the resistance heating elements 22, 24 are coil-shaped, but are not particularly limited to coil-shaped, and may be, for instance, a print pattern, and may be in a ribbon shape or a mesh shape.

In the above-described embodiment, an electrostatic electrode or an RF electrode may be built in by adding the resistance heating elements 22, 24 to the ceramic plate 20. When an electrostatic electrode is built in, the shaft inside area 20d of the ceramic plate 20 is provided with the terminal (one of the attached components) of the electrostatic electrode. The terminal of the electrostatic electrode is provided at a position other than the long groove 26a and in the shaft inside area 20d. When an RF electrode is built in, the shaft inside area 20d of the ceramic plate 20 is provided with the terminal (one of the attached components) of the RF electrode. The terminal of the RF electrode is provided at a position other than the long groove 26a and in the shaft inside area 20d.

In the above-described embodiment, the vertical length of the thermocouple guide 32 is substantially the same as the height of the cylindrical shaft 40. However, the vertical length may be shorter or longer than the height of the cylindrical shaft 40.

In the above-described embodiment, the inner circumferential side zone Z1 may be divided into multiple inner circumferential side small zones, and a resistance heating element may be drawn through each of the inner circumferential side small zones in a traversable manner. Also, the outer circumferential side zone Z2 may be divided into multiple outer circumferential side small zones, and a resistance heating element may be drawn through each of the outer circumferential side small zones in a traversable manner. Although the number of terminals increased according to the number of small zones, the long groove 26a is provided so as to enter the extended area 20f in the above-described embodiment, and thus the area where the terminals or the like can be arranged is increased. Thus, the situation with an increased number of terminals can be coped with.

In the above-described embodiment, the position of the recessed portion 49 may be determined after the position of the long groove 26a is determined or before the position of the long groove 26a is determined. In the latter case, the recessed portion 49 is regarded as one of the attached components, and the long groove 26a is defined so as not to pass through the recessed portion 49.

In the above-described embodiment, the power feeding rods 42a, 42b, 44a, 44b are respectively joined to the terminals 22a, 22b, 24a, 24b of the ceramic plate 20, the cylindrical shaft 40 is joined to the rear surface 20b of the ceramic plate 20, then the thermocouple guide 32 is attached. However, the attachment procedure is not limited to this. For instance, after the cylindrical shaft 40 is joined to the rear surface 20b of the ceramic plate 20, and the thermocouple guide 32 is attached, the power feeding rods 42a, 42b, 44a, 44b may be joined to the terminals 22a, 22b, 24a, 24b, respectively.

Figure 11:
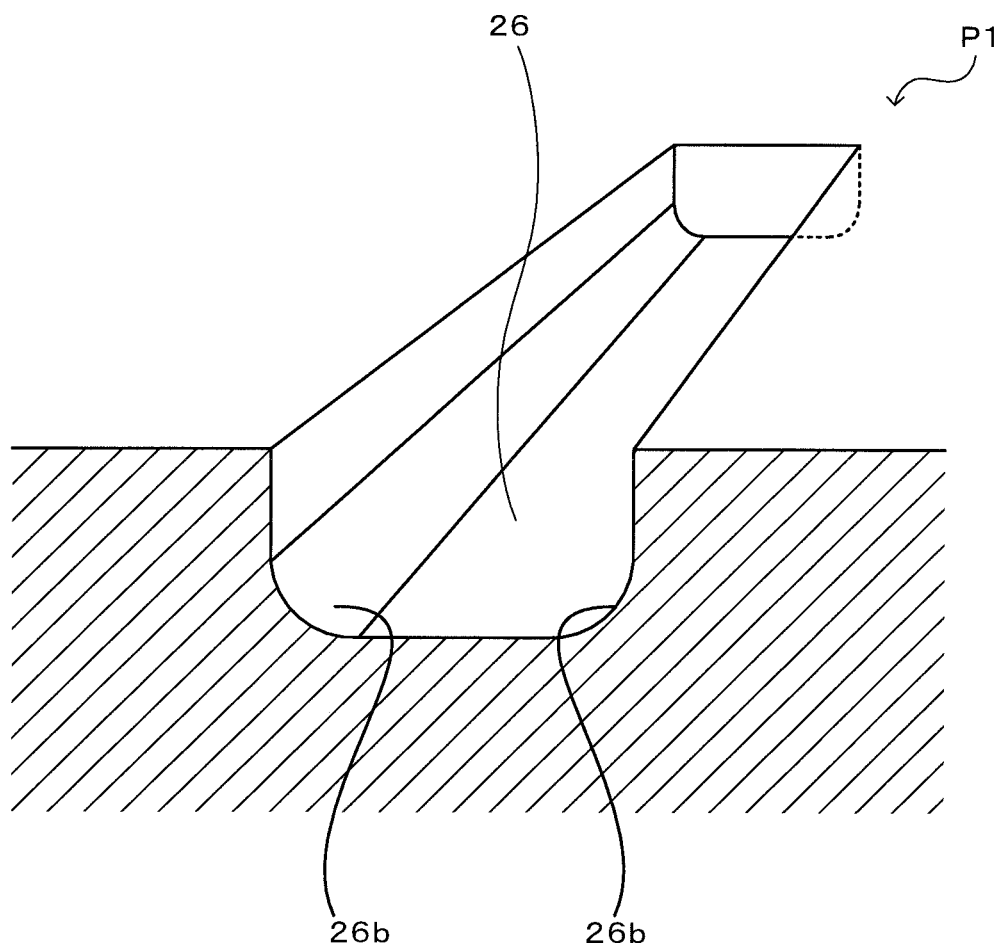
FIG. 11 is a perspective view of an upper side plate P1 with the rear surface thereof facing upward.

The long hole 26 in the above-described embodiment may have the shape illustrated in FIG. 11. FIG. 11 is a perspective view of the upper side plate P1 with the lower side plate P2 removed from the upper side plate P1 and the rear surface of the upper side plate P1 facing upward. The long hole 26 is a hole with a substantially quadrilateral cross section, and the boundary portion between the bottom face and each lateral face is a R-face. The curvature radius of the R-face is preferably greater than or equal to 0.5 mm (for instance, 1 mm). In this manner, it is possible to reduce the occurrence of crack starting from a boundary portion 26b between the bottom face (the ceiling face in FIG. 2) and a lateral face in the ceramic plate 20. Specifically, when the upper side plate P1 and the lower side plate P2 are joined under heat pressure conditions (for instance, at a temperature higher than or equal to 1600° C. and with a pressure higher than or equal to 7.0 kg/cm$^2$), the occurrence of crack starting from the boundary portion 26b can be reduced. Incidentally, when the curvature radius of the boundary portion 26b was 0.1 mm, 0.3 mm, crack occurred, but when the curvature radius was 0.5 mm, 0.7 mm, 0.9 mm, no crack occurred.

In the above-described embodiment, the thermocouple guide 32 is attached to the long groove 26a and the long hole 26. However, when the outer circumferential side thermocouple 50 is inserted in the long hole 26, the thermocouple guide 32 may be arranged in the long groove 26a and the long hole 26, and after the outer circumferential side thermocouple 50 is inserted in the long hole 26, the thermocouple guide 32 may be removed. Alternatively, the outer circumferential side thermocouple 50 may be inserted in the long hole 26 without using the thermocouple guide 32.

In the above-described embodiment, the long hole 26 may be a hole with a substantially quadrilateral cross section and a constant width from the start point 26s to the terminal position 26e. It is preferable that the boundary portion between the terminal face (standing wall at the terminal position 26e) of the long hole 26 and the longitudinally extending lateral face of the long hole 26 be a C-face or a R-face without a sharp edge. The width of the long hole 26 and the long groove 26a then is preferably less than or equal to 9 mm. This is because with the width less than or equal to 9 mm, when the outer circumferential side thermocouple 50 is inserted, the outer circumferential side thermocouple 50 is unlikely to be bent, and the temperature sensing part 50a of the outer circumferential side thermocouple 50 is easily arranged at a desired measurement point (a point, in the vicinity of the terminal position 26e, of the ceramic plate 20). When the curved portion 34 of the thermocouple guide 32 is inserted in the long hole 26 and the long groove 26a, it is sufficient that the width of the long hole 26 and the long groove 26a be greater than the outer diameter of the curved portion 34, but when the clearance (the value obtained by subtracting the outer diameter of the curved portion 34 from the width of the long hole 26 and the long groove 26a) in the width direction is too large, the temperature measurement accuracy is reduced due to loss of heat, thus the clearance in the width direction is preferably less than or equal to 2 mm. Similarly, the clearance in the depth direction is preferably less than or equal to 2 mm. Also, when the outer circumferential side thermocouple 50 is inserted as it is without using the thermocouple guide 32, it is sufficient that the width of the long hole 26 and the long groove 26a be greater than the outer diameter of the outer circumferential side thermocouple 50. The clearance (the value obtained by subtracting the outer diameter of the outer circumferential side thermocouple 50 from the width of the long hole 26 and the long groove 26a) in the width direction is preferably less than or equal to 2 mm due to the same reason mentioned earlier. Similarly, the clearance in the depth direction is preferably less than or equal to 2 mm.

Figure 12:
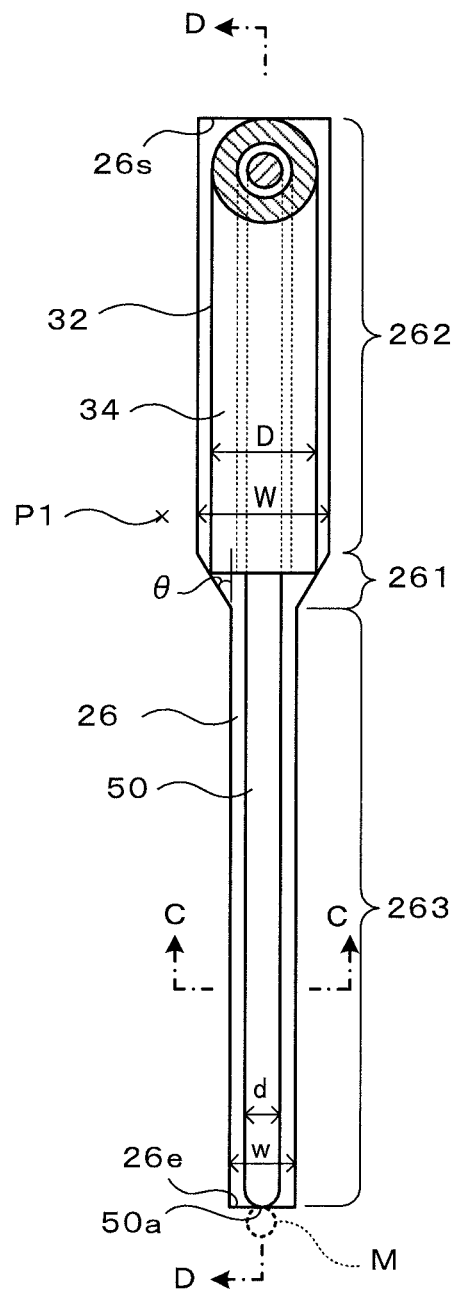
FIG. 12 is a rear view of the upper side plate P1 provided with a long hole 26 in another example.
Figure 13:
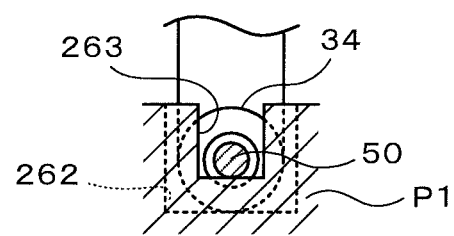
FIG. 13 is a cross-sectional view taken along C-C of FIG. 12.
Figure 14:
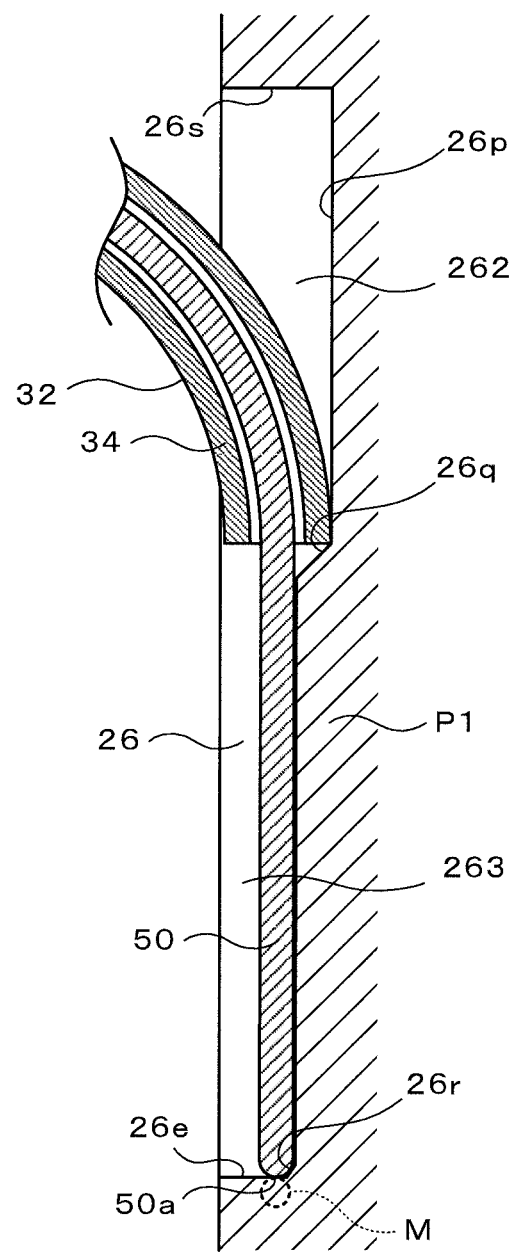
FIG. 14 is a cross-sectional view taken along D-D of FIG. 12.

In the above-described embodiment, a long hole 26 in another example illustrated in FIGS. 12 to 14 may be used as the long hole 26. FIG. 12 is a rear view of the upper side plate P1 provided with a long hole 26 in another example, FIG. 13 is a cross-sectional view taken along C-C of FIG. 12, and FIG. 14 is a cross-sectional view taken along D-D of FIG. 12. In a plan view, the long hole 26 has a tapered portion 261 in the middle of the path from the start point 26s to the terminal position 26e. The portion from the start point 26s to one end of the tapered portion 261 is a wide width portion 262. The portion from the other end of the tapered portion 261 to the terminal position 26e is a narrow width portion 263. The width W of the wide width portion 262 and the width w of the narrow width portion 263 are preferably less than or equal to 9 mm. This is because with the widths W, w less than or equal to 9 mm, when the outer circumferential side thermocouple 50 is inserted, the outer circumferential side thermocouple 50 is unlikely to be bent, and the temperature sensing part 50a is easily arranged at a desired measurement point M. When the curved portion 34 of the thermocouple guide 32 is arranged in the long hole 26, it is sufficient that the width W of the wide width portion 262 be greater than the outer diameter D of the curved portion 34, and the width w of the narrow width portion 263 be greater than the outer diameter d of the outer circumferential side thermocouple 50. The clearances (the value obtained by subtracting the outer diameter D of the curved portion 34 from the width W of the wide width portion 262 and the value obtained by subtracting the outer diameter d of the outer circumferential side thermocouple 50 from the width w of the narrow width portion 263) in the respective width directions are preferably less than or equal to 2 mm due to the same reason mentioned earlier. Similarly, the clearance in the depth direction is also preferably less than or equal to 2 mm. In this situation, when the curved portion 34 is designed to come into contact the tapered portion 261, the tapered portion 261 plays a role of temporarily fixing the thermocouple guide 32, thus the outer circumferential side thermocouple 50 is further easily inserted in the narrow width portion 263. The slope θ of the tapered portion 261 is preferably 2° or higher and 5° or lower, and more preferably 3° or higher and 4° or lower (for instance, 3.4°). As illustrated in FIG. 14, a bottom face 26p (the ceiling face in FIG. 2) of the long hole 26 includes an inclined step 26q in the middle of the path from the start point 26s to the terminal position 26e. The depth of the bottom face 26p from the start point 26s to the step 26q is greater than the depth from the step 26q to the terminal position 26e. The boundary between the bottom face 26p and the standing wall at the terminal position 26e is an inclined face 26r. The curved portion 34 of the thermocouple guide 32 is arranged in the portion, from the start point 26s to the step 26q, of the bottom face 26p, and the outer circumferential side thermocouple 50 is inserted along the portion, from the step 26q to the terminal position 26e, of the bottom face 26p. Thus, the outer circumferential side thermocouple 50 can be smoothly inserted in the long hole 26 utilizing the thermocouple guide 32. In addition, due to the presence of the inclined face 26r, the gap between the temperature sensing part 50a and the bottom face 26p is reduced, thus the temperature measurement accuracy of the temperature sensing part 50a is improved. It is to be noted that the bottom face 26p of the long hole 26 may be a flat face. When the outer circumferential side thermocouple 50 is inserted in the long hole 26 as it is without using the thermocouple guide 32, it is sufficient that the width W of the wide width portion 262 and the width w of the narrow width portion 263 be greater than the outer diameter d of the outer circumferential side thermocouple 50. The clearances (the value obtained by subtracting the outer diameter d of the outer circumferential side thermocouple 50 from the width W of the wide width portion 262 and the value obtained by subtracting the outer diameter d of the outer circumferential side thermocouple 50 from the width w of the narrow width portion 263) in the respective width directions are preferably less than or equal to 2 mm due to the same reason mentioned earlier. Similarly, the clearance in the depth direction is also preferably less than or equal to 2 mm.

In the above-described embodiment, the outer diameter d of the outer circumferential side thermocouple 50 is preferably 0.5 mm or greater and 2 mm or less. With the outer diameter d less than 0.5 mm, the outer circumferential side thermocouple 50 is bent when inserted in the long hole 26, thus insertion to the terminal position 26e is difficult. When the outer diameter d exceeds 2 mm, flexibility of the outer circumferential side thermocouple 50 is lost, thus it is difficult to insert the outer circumferential side thermocouple 50 to the terminal position 26e.

Figure 15:
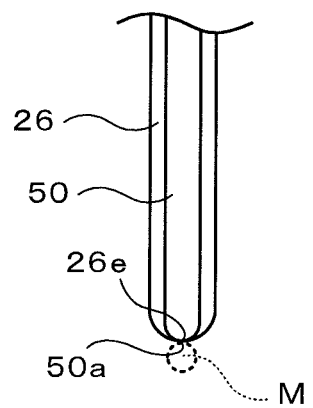
FIG. 15 is a plan view of another example of the temperature sensing part 50a of the outer circumferential side thermocouple 50 inserted in the long hole 26.
Figure 16:
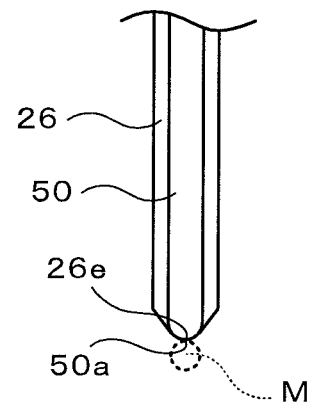
FIG. 16 is a plan view of another example of the temperature sensing part 50a of the outer circumferential side thermocouple 50 inserted in the long hole 26.

In the above-described embodiment, as illustrated in FIG. 15 and FIG. 16, the temperature sensing part 50a of the outer circumferential side thermocouple 50 may be a convex curved face, and of the terminal face (the standing wall at the terminal position 26e), the portion in contact with the temperature sensing part 50a may be a concave curved face. In this manner, the temperature sensing part 50a of the outer circumferential side thermocouple 50 comes into surface contact with or nearly surface contact with the terminal face of the long hole 26, which is a desired measurement point M, thus the temperature measurement accuracy is improved.

Figure 17:
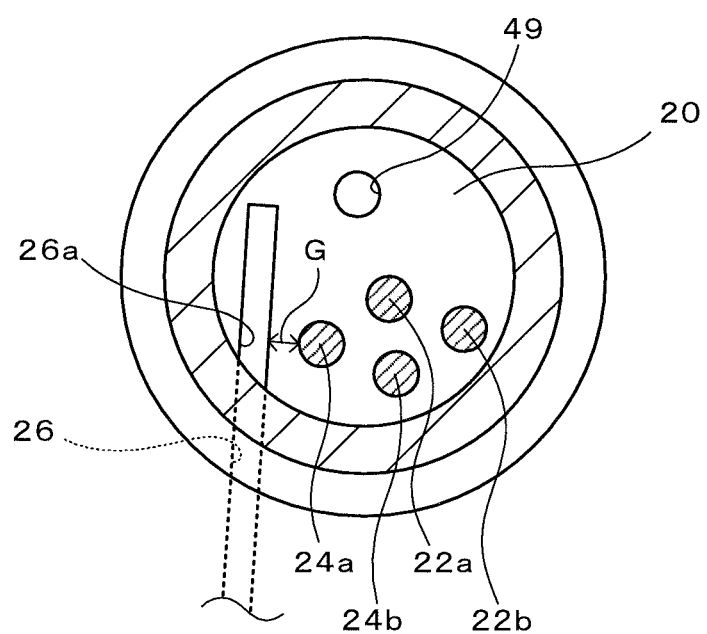
FIG. 17 is an explanatory view illustrating a gap G between a long groove 26a and each of the attached components.

In the above-described embodiment, as illustrated in FIG. 17, the gap G between the long groove 26a and each of the attached components (terminals 22a, 22b, 24a, 24b and the recessed portion 49) is preferably greater than or equal to 2 mm. In this manner, it is possible to prevent the occurrence of crack in the ceramic plate 20 due to a narrow gap between the long groove 26a and each of the attached components.

Figure 18:
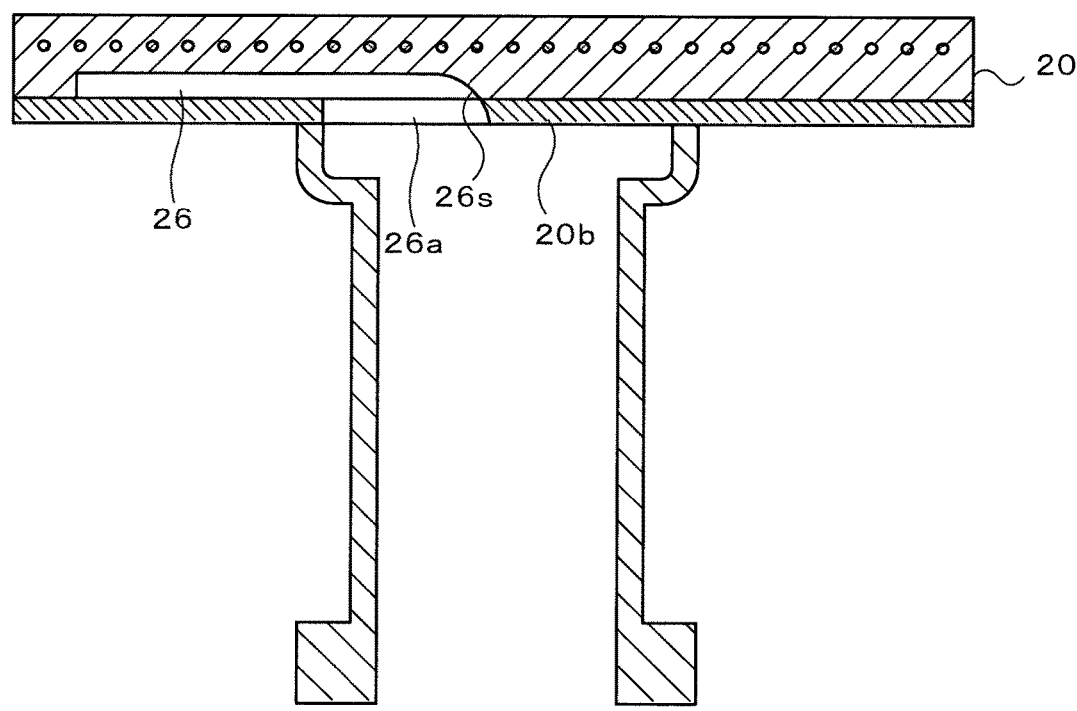
Figure 19:
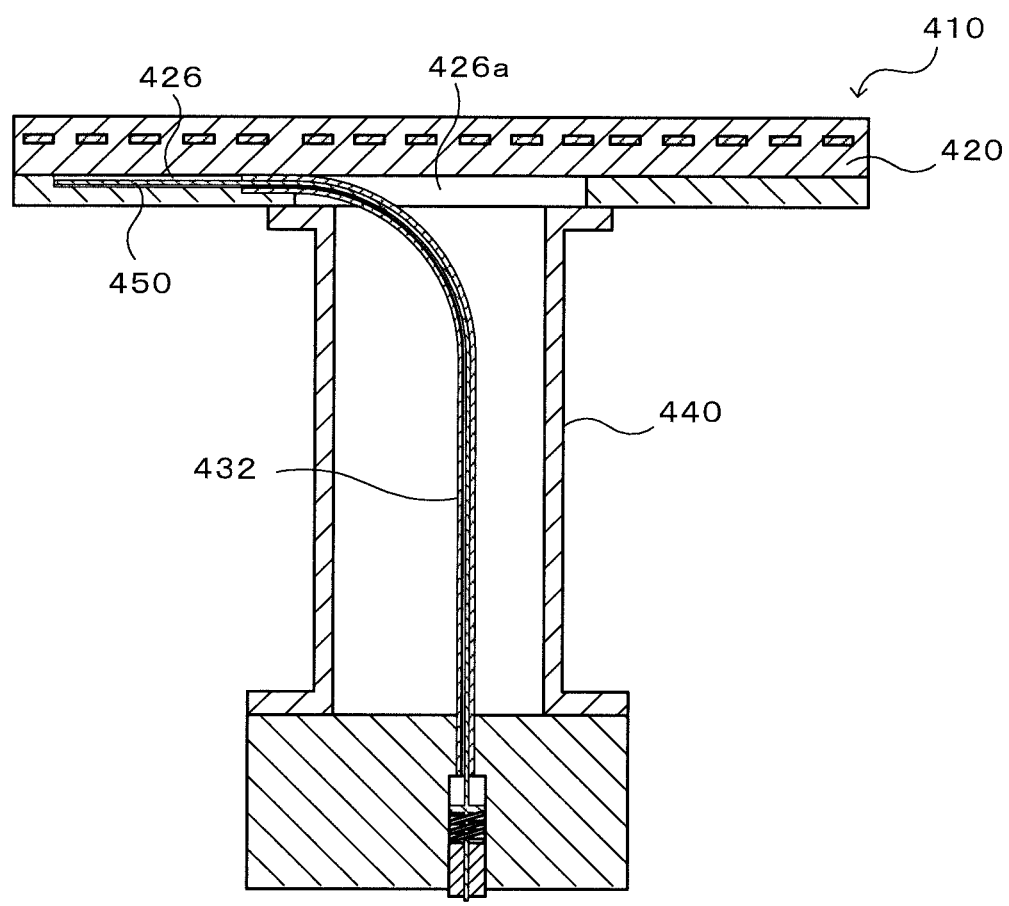
FIG. 19 is an explanatory view of a conventional example.

In the above-described embodiment, as illustrated in FIG. 18, the standing wall, on the side of the start point 26s, of the long hole 26 and the long groove 26a may be bent from the rear surface 20b of the ceramic plate 20 toward the back of the long hole 26. In this manner, without using the thermocouple guide 32, the outer circumferential side thermocouple 50 can be smoothly inserted in the long hole 26 utilizing the standing wall bent at the start point 26s.

The present application claims priority from JP Patent Application No. 2018-238226 filed Dec. 20, 2018, the entire contents of which are incorporated herein by reference.

What is claimed is:

1. A ceramic heater comprising:
a disc-shaped ceramic plate having a wafer mounting surface, the disc-shaped ceramic plate being divided into a small inner circumferential side zone and a circular ring-shaped outer circumferential side zone that surrounds the small inner circumferential side zone;
a cylindrical shaft having a small diameter portion and a large diameter portion, which has a diameter that is larger than the diameter of the small diameter portion, having an end face joined to a rear surface of the ceramic plate, the rear surface being on an opposite side of the wafer mounting surface;
an inner circumferential side resistance heating element which is embedded in the small inner circumferential size zone of the ceramic plate;
an outer circumferential side resistance heating element which is embedded in the circular ring-shaped outer circumferential side zone of the ceramic plate;
attached components including a pair of terminals of the inner circumferential side resistance heating element and a pair of terminals of the outer circumferential side resistance heating element; and
a hole extending from a start point in an inside area of the small diameter portion of the rear surface of the ceramic plate to a predetermined terminal position of the circular ring-shaped outer circumferential side zone of the ceramic plate;
wherein an internal space of the cylindrical shaft has a circular cylinder shaped space having a diameter equal to an inner diameter of the small diameter portion, and a ring-shaped extended space which is on an outer side of the circular cylinder shaped space and surrounded by the large diameter portion,
an entrance portion of the hole is groove,
the groove is provided to extend from the start point to an extended area within the ring-shaped extended space of the rear surface of the ceramic plate,
the attached components are provided at a position other than the groove and within the inside area of the small diameter portion of the rear surface of the ceramic plate;
the groove is used to arrange a curved portion included in a thermocouple guide having a vertical portion extending in a vertical direction with respect to the wafer mounting surface, the curved portion being configured to change a direction from the vertical direction to a horizontal direction; and
an outer diameter of the curved portion of the thermocouple guide is smaller than an outer diameter of the vertical portion.

2. The ceramic heater according to claim 1, wherein the groove is provided along a radial direction of the ceramic plate.

3. The ceramic heater according to claim 1, wherein the groove is provided along a direction deviated from a radial direction of the ceramic plate.

4. The ceramic heater according to claim 1, wherein the hole is a thermocouple insertion hole in which a thermocouple is inserted.

5. The ceramic heater according to claim 1, further comprising
the thermocouple guide arranged in the groove.

6. The ceramic heater according to claim 5, further comprising
a thermocouple inserted in the thermocouple guide and the hole.

7. The ceramic heater according to claim 6, wherein a temperature sensing part of the thermocouple is arranged to fall within a width of the outer circumferential side resistance heating element when the ceramic plate is viewed from the rear surface.

8. The ceramic heater according to claim 7, wherein the temperature sensing part of the thermocouple is a convex curved face, and a portion of the terminal face of the hole is a concave curved face, the portion being in contact with the temperature sensing part of the thermocouple.

9. The ceramic heater according to claim 1, wherein the hole is a hole with a substantially quadrilateral cross section, and a boundary portion between a ceiling face and a lateral face of the hole is a R-face with a curvature radius of 0.5 mm or greater.

10. The ceramic heater according to claim 1, wherein the hole has a tapered portion in a middle of a path from the start point to the terminal position, a portion from the start point to one end of the tapered portion is a wide width portion, and a portion from the other end of the tapered portion to the terminal position is a narrow width portion.

11. The ceramic heater according to claim 1, wherein a ceiling face of the hole has an inclined step in a middle of a path from the start point to the terminal position, and a depth of the ceiling face from the start point to the step is greater than a depth from the step to the terminal position.

12. The ceramic heater according to claim 1, wherein a gap between the groove and each of the attached components is 2 mm or greater.

13. The ceramic heater according to claim 1, wherein a wall, on a side of the start point, of the hole is curved from the rear surface of the ceramic plate toward a back of the hole.

* * * * *